(12) United States Patent
Jung et al.

(10) Patent No.: US 7,183,155 B2
(45) Date of Patent: Feb. 27, 2007

(54) NON-VOLATILE MEMORY DEVICE AND FABRICATING METHOD THEREOF

(75) Inventors: Sung Mun Jung, Kyunggido (KR); Jum Soo Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/019,299

(22) Filed: Dec. 23, 2004

(65) Prior Publication Data

US 2005/0139901 A1    Jun. 30, 2005

(30) Foreign Application Priority Data

Dec. 27, 2003    (KR) .................... 10-2003-0098361

(51) Int. Cl.
*H01L 21/8238*    (2006.01)
(52) U.S. Cl. ...................... 438/223; 438/224
(58) Field of Classification Search ............... 438/218, 438/223, 224
See application file for complete search history.

(56) References Cited

U.S. PATENT DOCUMENTS 5,358,891 A * 10/1994 Tsang et al. ............... 438/426
6,438,030 B1 * 8/2002 Hu et al. ............... 365/185.18
6,909,139 B2 * 6/2005 Shum et al. ................ 257/315

* cited by examiner

Primary Examiner—Doug Menz
(74) Attorney, Agent, or Firm—Finnegan, Henderson, Farabow, Garrett & Dunner, L.L.P.

(57) ABSTRACT

The present invention provides a non-volatile memory device and fabricating method thereof, by which a cell size can be lowered despite high degree of cell integration and by which the device fabrication is facilitated. The present invention includes at least two trench isolation layers arranged in a device isolation area of a semiconductor substrate, each having a first depth, a first conductive type well arranged between the at least two trench isolation layers to have a second depth smaller than the first depth, a second conductive type source region and a second conductive type drain region arranged in a prescribed upper part of the first conductive type well to be separated from each other by a channel region in-between, an ONO layer on the channel region of the semiconductor substrate, the ONO layer comprising a lower oxide layer, a nitride layer, and an upper oxide layer, and a wordline conductor layer on the ONO layer.

7 Claims, 7 Drawing Sheets

FIG. 1
Related Art

| Type | Cell (core) size | | | Chip size according to degree of intergration | | | | |
|---|---|---|---|---|---|---|---|---|
| | Expecfation cell size ($\mu M^2$) | Core size/1M ($\mu M^2$) | Array size/1M ($\mu M^2$) | 1K | 10K | 100K | 1M | 10M |
| Single poly type EEPROM | 100 | 0.72 | 100.72 | 1.47 | 2.38 | 11.44 | 102 | 1008 |
| Dual poly type EEPROM | 11.23 | 0.72 | 11.95 | 1.38 | 1.49 | 2.57 | 13.3 | 120 |
| Stackecl gate type EEPROM | 0.28 | 0.72 | 1 | 2.87 | 2.88 | 2.97 | 3.87 | 12.87 |
| Divied gate type EEPROM | 0.6 | 0.72 | 1.32 | 2.12 | 2.13 | 2.25 | 3.44 | 15.32 |
| SONOS type EEPROM | 2.16 | 0.72 | 2.88 | 1.37 | 1.40 | 1.66 | 4.25 | 30.17 |

FIG. 2
Related Art

|   | Type | The number of mask layers in 0.18μm log=c process | | |
|---|---|---|---|---|
|   |   | DUV | i-Line | Type |
| 1 | Single poly type EEPROM | 0 | 2 | 2 |
| 2 | Dual poly type EEPROM | 2 | 8 | 10 |
| 3 | Stackecl gate type EEPROM | 3 | 7 | 10 |
| 4 | Divied gate type EEPROM | 3 | 7 | 10 |
| 5 | SONOS type EEPROM | 0 | 4 | 4 |

FIG. 9

| Type | Cell (core) size | | | Chip size according to degree of intergration | | | | | | |
|---|---|---|---|---|---|---|---|---|---|---|
| | Expecfation cell size ($\mu M^2$) | Core size/1M ($\mu M^2$) | Array size/1M ($\mu M^2$) | 1K | 10K | 100K | 1M | 10M | 100M |
| Single poly type EEPROM | 100 | 0.72 | 100.72 | 1.47 | 2.38 | 11.44 | 102 | 1008 | 10073 |
| Dual poly type EEPROM | 11.23 | 0.72 | 11.95 | 1.38 | 1.49 | 2.57 | 13.3 | 120 | 1196 |
| Stackecl gate type EEPROM | 0.28 | 0.72 | 1 | 2.87 | 2.88 | 2.97 | 3.87 | 12.87 | 102 |
| Divied gate type EEPROM | 0.6 | 0.72 | 1.32 | 2.12 | 2.13 | 2.25 | 3.44 | 15.32 | 134 |
| SONOS type EEPROM according to prior art | 2.16 | 0.72 | 2.88 | 1.37 | 1.40 | 1.66 | 4.25 | 30.17 | 289 |
| SONOS type EEPROM according to present invention | 0.486 | 0.72 | 1.21 | 1.37 | 1.38 | 1.49 | 2.58 | 13.43 | 121 |

NON-VOLATILE MEMORY DEVICE AND FABRICATING METHOD THEREOF

This application claims the benefit of the Korean Application No. P2003-0098361 filed on Dec. 27, 2003, which is hereby incorporated by reference.

BACKGROUND OF THE INVENTION

1. Field of the Invention

The present invention relates to a non-volatile memory device and fabricating method thereof, and more particularly, to an embedded non-volatile memory device having a high integration degree and fabricating method thereof.

2. Discussion of the Related Art

Lately, developments for non-volatile memory devices capable of keeping data despite power cut-off are rapidly in progress. As non-volatile memory devices, there are single poly type EEPROM, dual poly type EEPROM, stacked gate type flash memory device, split gate type flash memory device, SONOS flash memory device, and the like. In many applications of the non-volatile memory devices, the embedded non-volatile memory device combining logic and memory therein employs various kinds of non-volatile memory devices according to the integration requirements and the like.

FIG. 1 is a table for cell and chip sizes of various non-volatile memory devices. And, FIG. 2 is a table for the number of mask layers in 0.18 μm logic process for various non-volatile memory devices.

Referring to FIG. 1 and FIG. 2, if the degree of cell integration exceeds 100K in case of the single poly type EEPROM having the simplest process, i.e., the smallest number of mask layers in the 0.18 μm logic process, the cell and chip sizes are too large to be efficient.

On the contrary, in case of the stacked gate type flash memory device, if the degree of cell integration becomes at least 1M, the corresponding fabrication is very complicated despite its high degree of integration.

And, in case of the SONOS flash memory device, the cell size is relatively small at the low degree of integration and its fabrication is simple.

FIG. 3 is a layout of an embedded non-volatile memory device having the SONOS configuration according to a related art. And, FIG. 4 and FIG. 5 are cross-sectional diagrams of the memory device bisected along cutting lines IV–IV' and V–V', respectively.

Referring to FIGS. 3 to 5, an n-well 104 is formed in an upper part of a semiconductor substrate 102 and an active area is defined in an upper part of the n-well 104 of the semiconductor substrate 102 by a shallow trench isolating (STI) layer 101. And, a p-well 106 is arranged in the active area. Since the shallow trench isolation layer 101 is used, a bottom of the p-well 106 is lower than that of the trench isolation layer 101. And, an $n^+$ source region 108, $n^+$ drain region 110, and $p^+$ contact region 120 are separately arranged in an upper part of the p-well 106.

A channel region lies between the $n^+$ source region 108 and the $n^+$ drain region 110. An ONO (lower oxide layer/nitride layer/upper oxide layer) layer 122 is arranged on the channel region. And, a conductor layer 124 as a wordline is arranged on the ONO layer 122. In the ONO layer 122, the lower oxide layer is a tunnel oxide layer, the nitride layer is a charge trap layer, and the upper oxide layer is an insulating layer.

The $n^+$ drain region 110 is electrically connected to a first metal electrode 126 via a first contact plug 128. And, the $p^+$ drain region 120 is electrically connected to a second metal electrode 130 via a second contact plug 132. Moreover, the $n^+$ source region 108 is electrically connected to a third metal electrode (not shown in the drawing).

In the above-configured SONOS flash memory device, a length of a unit cell C1 is total 2.6 μm by adding a width 0.6 μm of the p-well 106 to a width 2.0 μm of the shallow trench isolating layer 101. And, a width of the unit cell C1 is 0.81 μm. Hence, an area of the unit cell C1 is 2.16 μm².

However, even if the cell size, as shown in the table of FIG. 1, is relatively small in case of low integration degree, e.g., integration degree smaller than 10M, the cell size increases in case of the cell integration degree above 10M to weaken the competitiveness.

SUMMARY OF THE INVENTION

Accordingly, the present invention is directed to a non-volatile memory device and fabricating method thereof that substantially obviates one or more problems due to limitations and disadvantages of the related art.

An object of the present invention is to provide a non-volatile memory device and fabricating method thereof, by which a cell size can be lowered despite high degree of cell integration and by which the device fabrication is facilitated.

Another object of the present invention is to provide a non-volatile memory device and fabricating method thereof, by which an embedded non-volatile memory device can be fabricated.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a non-volatile memory device according to the present invention includes at least two trench isolation layers arranged in a device isolation area of a semiconductor substrate, each having a first depth, a first conductive type well arranged between the at least two trench isolation layers to have a second depth smaller than the first depth, a second conductive type source region and a second conductive type drain region arranged in a prescribed upper part of the first conductive type well to be separated from each other by a channel region in-between, an ONO layer on the channel region of the semiconductor substrate, the ONO layer comprising a lower oxide layer, a nitride layer, and an upper oxide layer, and a wordline conductor layer on the ONO layer.

Preferably, the first depth of the trench isolation layer is equal to or greater than 5,000 Å.

More preferably, the first depth of the trench isolation layer is equal to or greater than 8,000 Å and the second depth of the first conductive type well is 6,000 Å.

Preferably, the lower oxide layer is a tunnel oxide layer, the nitride layer is a charge trap layer, and the upper oxide layer is an insulating layer.

Preferably, the non-volatile memory device further includes a second conductive type well enclosing the first conductive type well within the semiconductor substrate.

In another aspect of the present invention, a method of fabricating a non-volatile memory device includes the steps of forming at least two trench isolation layers having a first depth each in a device isolation area of a semiconductor substrate, forming a first conductive type well having a second depth smaller than the first depth -in an active area of the semiconductor substrate defined by the at least two trench isolation layers, forming an ONO layer on a prescribed upper area of the first conductive type well wherein the ONO layer includes a lower oxide layer, a nitride layer, and an upper oxide layer, forming a wordline conductor layer on the ONO layer, and forming source and drain regions in the prescribed upper area of the first conductive type well.

Preferably, the first depth of the trench isolation layer is equal to or greater than 5,000 Å.

Preferably, the first depth of the trench isolation layer is equal to or greater than 8,000 Å and the second depth of the first conductive type well is 6,000 Å.

Preferably, the lower oxide layer is a tunnel oxide layer, the nitride layer is a charge trap layer, and the upper oxide layer is an insulating layer.

Preferably, the tunnel oxide layer is formed about 10~50 Å thick, the nitride layer is formed about 50~160 Å thick, and the insulating layer is formed about maximum 80 Å thick.

Preferably, the tunnel oxide layer and the nitride layer are formed by thermal oxidation and chemical vapor deposition, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a table for cell and chip sizes of various non-volatile memory devices;

FIG. 2 is a table for the number of mask layers in 0.18 μm logic process for various non-volatile memory devices;

FIG. 9 is a table for explaining improvement of an embedded non-volatile memory device according to the present invention in chip size according to cell size and integration degree.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
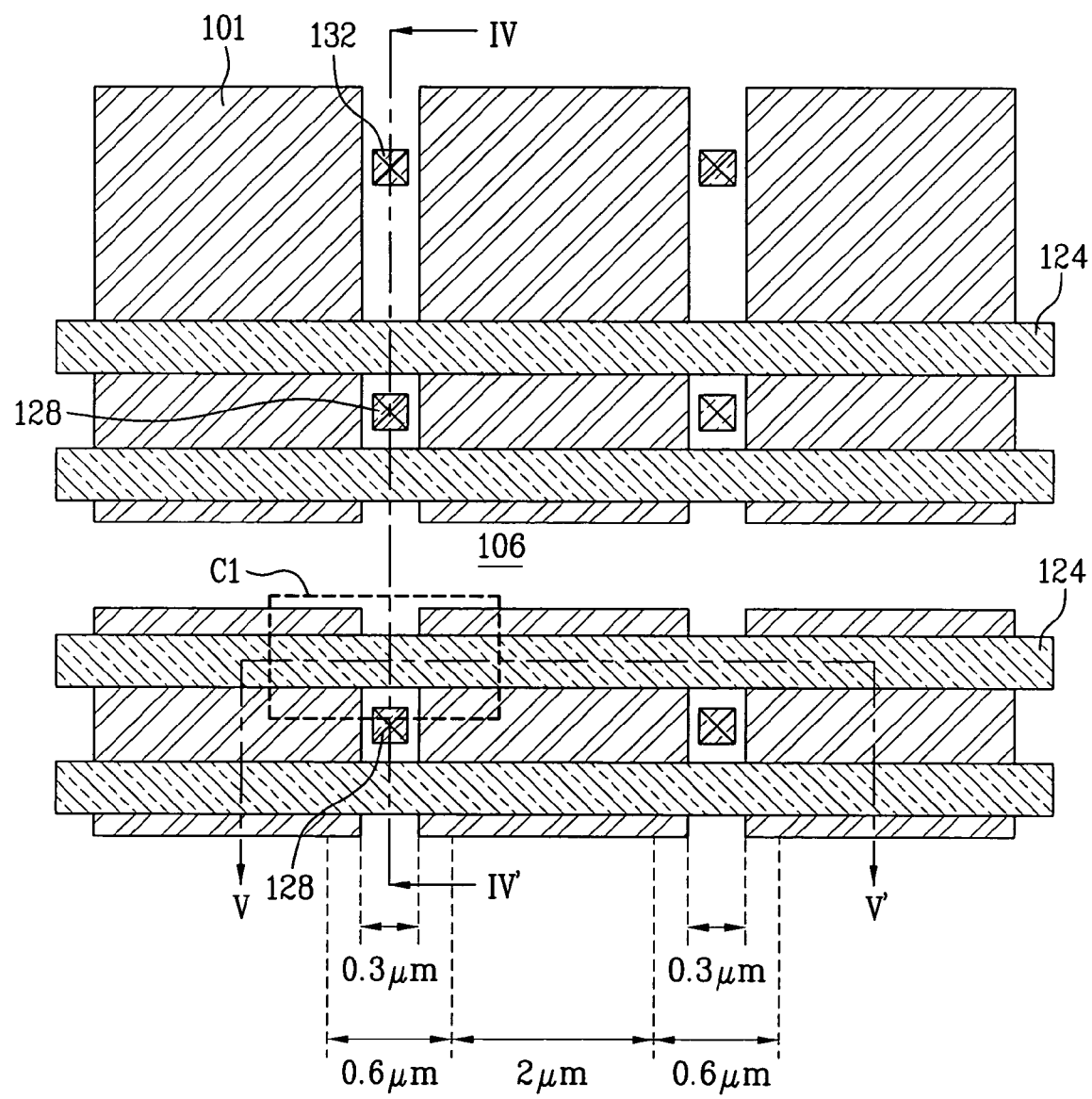
FIG. 3 is a layout of an embedded non-volatile memory device having the SONOS configuration according to a related art.
Figure 4:
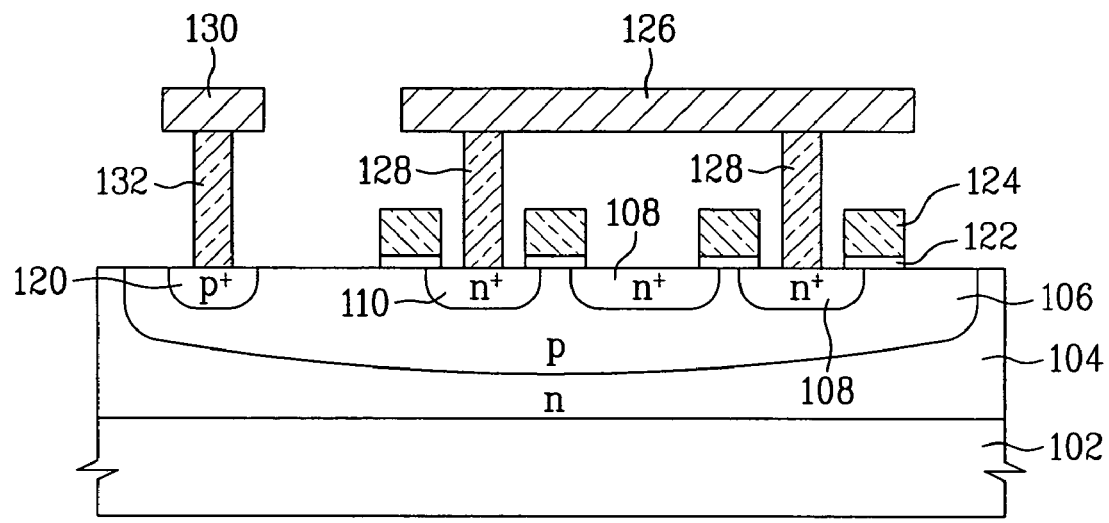
FIG. 4 and FIG. 5 are cross-sectional diagrams of the memory device bisected along cutting lines IV–IV' and V–V' in FIG. 3, respectively.
Figure 5:
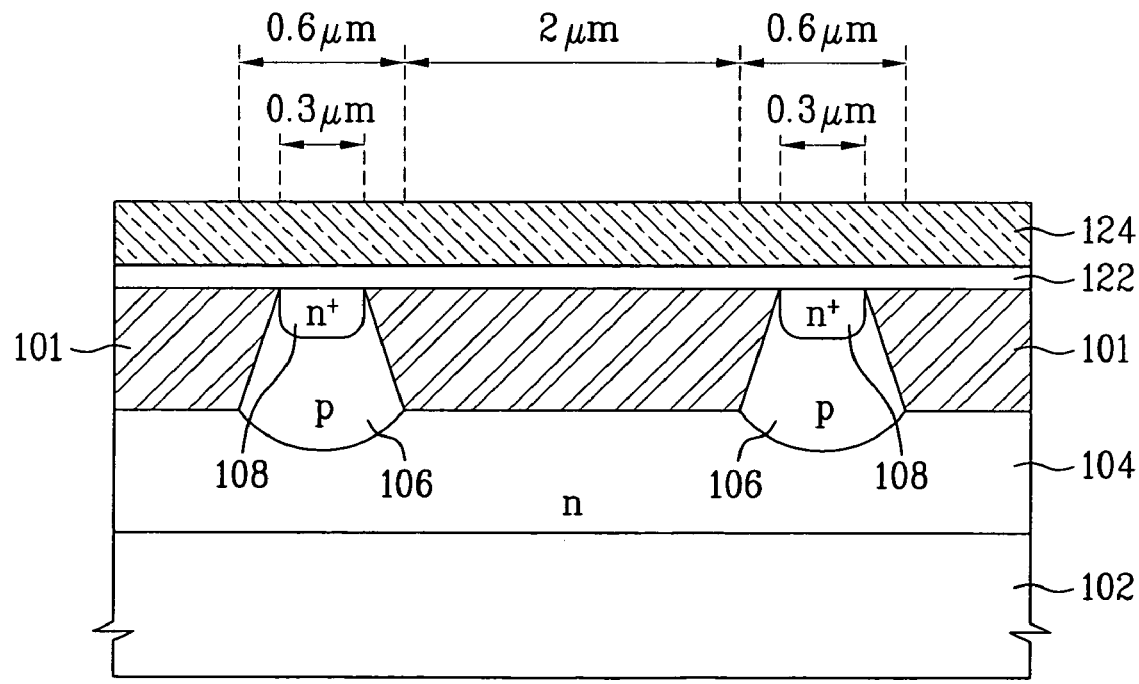
Figure 6:
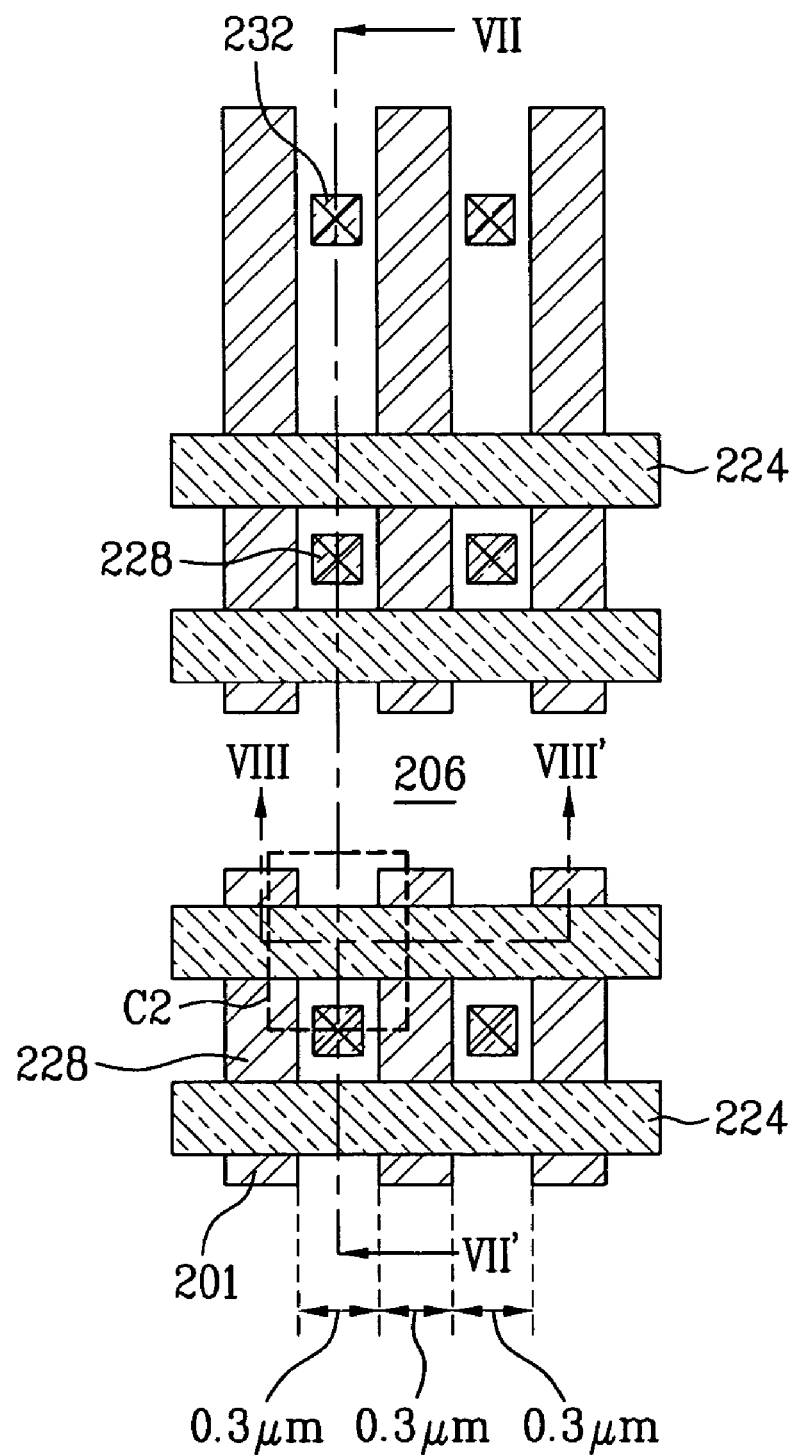
FIG. 6 is a layout of an embedded non-volatile memory device having the SONOS configuration according to the present invention.
Figure 7:
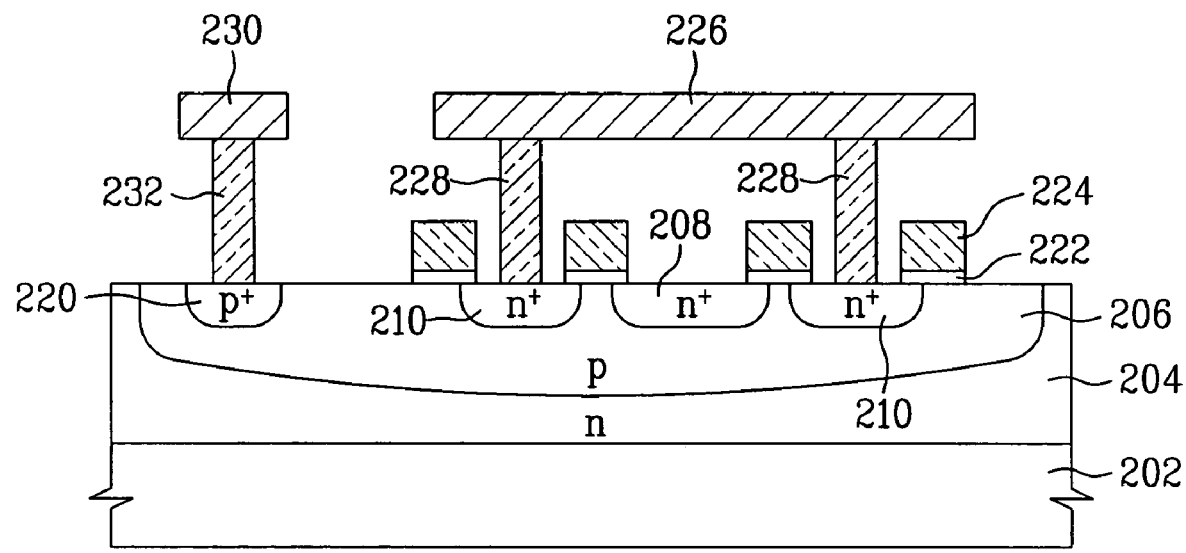
FIG. 7 and FIG. 8 are cross-sectional diagrams of the memory device bisected along cutting lines VII–VII' and VIII–VIII' in FIG. 6, respectively.
Figure 8:
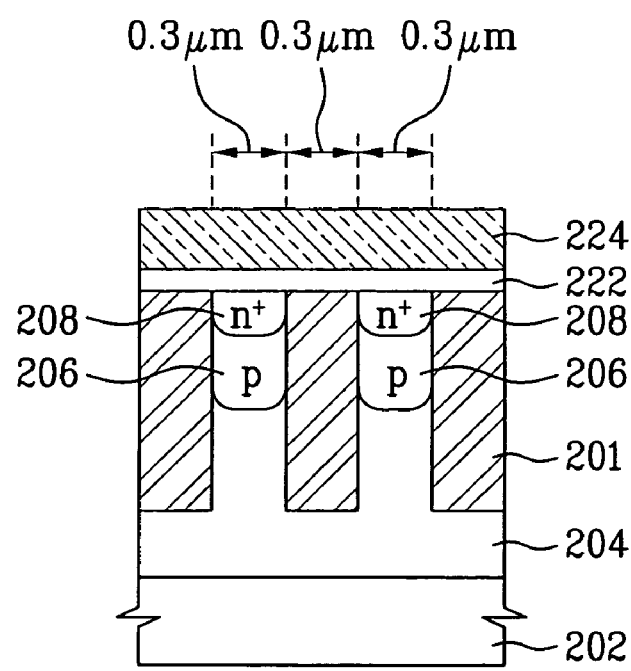

FIG. 6 is a layout of an embedded non-volatile memory device having the SONOS configuration according to the present invention. FIG. 7 and FIG. 8 are cross-sectional diagrams of the memory device bisected along cutting lines VII–VII' and VIII–VIII' in FIG. 6, respectively.

Referring to FIGS. 6 to 8, an n-well 204 is provided to an upper part of a semiconductor substrate 202 and an active area is defined in an upper part of the n-well 204 of the semiconductor substrate 202 by a trench isolating (TI) layer 201. And, a p-well 206 is arranged in the active area. A depth of the trench isolation layer 201 is minimum 5,000 Å and is preferably set to about 8,000 Å. A depth of the p-well 206 is smaller than that of the trench isolation layer 201 and is preferably set to about 6,000 Å.

An $n^+$ source region 208, $n^+$ drain region 210, and $p^+$ contact region 220 are separately provided to an upper part of the p-well 206.

A channel region lies between the $n^+$ source region 208 and the $n^+$ drain region 210. An ONO (lower oxide layer/nitride layer/upper oxide layer) layer 222 is arranged on the channel region. And, a conductor layer 224 as a wordline is arranged on the ONO layer 222. In the ONO layer 222, the lower oxide layer is a tunnel oxide layer about 10~50 Å thick, the nitride layer is a charge trap layer about 10~160 Å thick, and the upper oxide layer is an insulating layer about maximum 80 Å thick. And, the wordline conductor layer 224 includes a polysilicon layer.

The $n^+$ drain region 210 is electrically connected to a first metal electrode 226 via a first contact plug 228. And, the $p^+$ drain region 220 is electrically connected to a second metal electrode 230 via a second contact plug 232. Moreover, the $n^+$ source region 208 is electrically connected to a third metal electrode (not shown in the drawing).

In the above-configured embedded non-volatile memory device, in order to make the depth of the trench isolation layer 201 deeper than that of the p-well 206, the deep trench isolation layer 201 is used instead of the related art shallow trench isolation layer. In doing so, a bottom width of the p-well 206 is reduced to about 0.3 μm as well as a width of the trench isolation layer 210, i.e., an interval between the p-wells 206 is reduced to about 0.3 μm. The bottom width of the p-well 206 is shortened since a sidewall of the deep trench isolation layer 201 has a vertical profile. Specifically, horizontal expansion of a lower part of the p-well 206 is suppressed by the deep trench isolation layer 201, whereby the lower part of the p-well 206 has the almost same width of the upper part of the p-well 206.

Accordingly, a length of a unit cell C2 is total 0.6 μm by adding a width 0.3 μm of the p-well 206 to a width 0.3 μm of the deep trench isolating layer 201. And, a width of the unit cell C2 is 0.81 μm. Hence, an area of the unit cell C1 is 0.486 μm². This indicates that the present invention has 77.5% increment of the integration degree higher than that of the related art.

FIG. 9 is a table for explaining improvement of an embedded non-volatile memory device according to the present invention in chip size according to cell size and integration degree.

Referring to FIG. 9, the embedded non-volatile memory device, i.e., the SONOS flash memory device, according to the present invention has 77.5% increment of the integration degree higher than that of the related art SONOS flash memory device. Hence, the present invention enables the reduced chip size for the cell integration degree of at least 10M. Specifically, the embedded non-volatile memory device according to the present invention is competitive in the high integration degree of at least 100M.

A method of fabricating an embedded non-volatile memory device according to the present invention is explained as follows.

First of all, a trench isolation layer 202 is formed in a device isolation area or field area of a semiconductor substrate 202. Specifically, a trench etch mask layer pattern (not shown in the drawing) including a pad oxide layer and a nitride layer is preferentially formed on the semiconductor substrate 202. An exposed portion of the semiconductor substrate 202 is removed to form a trench using the trench etch mask layer pattern. In doing so, a depth of the trench is set to about maximum 5,000 Å and is preferably set to about 8,000 Å. The trench is filled up with a filling insulating layer. And, planarization, recess, and trench etch mask layer pattern removal processes are carried out on the filling insulating layer to complete the deep trench isolation layer 201.

Subsequently, n type ion implantation is carried out on the substrate to form a n-well 204, and p type ion implantation is carried out on the substrate to form a p-well 206. In doing so, a depth of the p-well is set smaller than that of the trench isolation layer and is preferably set to about 6,000 Å. And, BF2 ion and boron are used as p type impurity ions. Thus, by forming the p-well 206 having a relatively shallow depth, the same ion implantation mask layer pattern can be used in carrying out the n type ion implantation and the p type ion implantation. And, impurity ion implantation for threshold voltage adjustment is then carried out on the channel region of the p well 206.

Subsequently an ONO (lower oxide layer/nitride layer/upper oxide layer) layer 222 is formed over the substrate. In forming the ONO layer 222, the lower oxide layer is formed about 10~50 Å thick, the nitride layer is formed about 10~160 Å thick, and the upper oxide layer is formed about maximum 80 Å thick. And, the lower oxide layer and the nitride layer are formed by thermal oxidation and chemical vapor deposition, respectively.

And, a wordline conductor layer 224 is formed on the ONO layer 222 using a polysilicon layer.

The wordline conductor layer 224 and the ONO layer 222 are patterned by photolithography to expose portions of the p-well 206. Ion implantations are then carried out on the substrate to form an n$^+$ source region 208, an n$^+$ drain region 210, and a p$^+$ drain region 220.

Finally, first and second metal electrodes 126 and 130 are formed by a general wiring process.

Accordingly, in the embedded non-volatile memory device according to the present invention, the deep trench isolation layer is used as the device isolation layer to shorten the interval between the p-wells, whereby the chip size can be sufficiently reduced with the SONOS configuration despite high cell integration degree.

And, in the method of fabricating the embedded non-volatile memory device according to the present invention, the p-well is formed shallower than the trench isolation layer to use the same ion implantation mask layer patter in the p-well ion implantation and the n-well ion implantation, whereby the number of the overall process steps and the number of mask layer patterns can be lowered.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a non-volatile memory device, comprising the steps of:
    forming at least two trench isolation layers having a first depth each in a device isolation area of a semiconductor substrate, wherein the trench isolation layers comprise sidewalls having vertical profiles;
    forming a first conductive type well having a second depth smaller than the first depth in an active area of the semiconductor substrate defined by the at least two trench isolation layers, wherein a width of a lower part of the first conductive the well is equal to that of an upper part of the first conductive type well;
    forming an ONO layer on a prescribed upper area of the first conductive type well wherein the ONO layer comprises a lower oxide layer, a nitride layer, and an upper oxide layer;
    forming a wordline conductor layer on the ONO layer; and
    forming source and drain regions in the prescribed upper area of the first conductive type well.

2. The method of claim 1, wherein the first depth of the first trench isolation layer is equal to or greater than 5,000 Å.

3. The method of claim 2, wherein the first depth of the trench isolation layer is equal to or greater than 8,000 Å and the second depth of the first conductive type well is 6,000 Å.

4. The method of claim 1, wherein the lower oxide layer is a tunnel oxide layer, the nitride layer is a charge trap layer, and the upper oxide layer is an insulating layer.

5. The method of claim 4, wherein the tunnel oxide layer is formed about 10~50Å thick, the nitride layer is formed about 50~60 Å thick, and the insulating layer is formed about maximum 80 Å thick.

6. The method of claim 4, wherein the tunnel oxide layer and the nitride layer are formed by thermal oxidation and chemical vapor deposition, respectively.

7. A method of fabricating a non-volatile memory device, comprising the steps of:
    forming at least two trench isolation layers having a first depth each in a device isolation area of a semiconductor substrate, wherein the trench isolation layers comprise sidewalls having vertical profiles, the sidewalls being perpendicular to the substrate;
    forming a first conductive type well having a second depth smaller than the first depth in an active area of the semiconductor substrate defined by the at least two trench isolation layers;
    forming an ONO layer on a prescribed upper area of the first conductive type well wherein the ONO layer comprises a lower oxide layer, a nitride layer, and an upper oxide layer;
    forming a wordline conductor layer on the ONO layer; and
    forming source and drain regions in the prescribed upper area of the first conductive type well.

* * * * *